US006809563B2

United States Patent
Schaal

(10) Patent No.: US 6,809,563 B2
(45) Date of Patent: Oct. 26, 2004

(54) FAST SWEEP VOLTAGE RAMP GENERATOR AND STREAK CAMERA USING SAME

(75) Inventor: Alfred Schaal, Massy (FR)

(73) Assignee: Commissariat a l'Energie Atomique, Paris (FR)

( * ) Notice: Subject to any disclaimer, the term of this patent is extended or adjusted under 35 U.S.C. 154(b) by 39 days.

(21) Appl. No.: 10/257,367

(22) PCT Filed: Apr. 13, 2001

(86) PCT No.: PCT/FR01/01157
§ 371 (c)(1),
(2), (4) Date: Oct. 16, 2002

(87) PCT Pub. No.: WO01/80424
PCT Pub. Date: Oct. 25, 2001

(65) Prior Publication Data
US 2003/0090304 A1 May 15, 2003

(30) Foreign Application Priority Data
Apr. 17, 2000 (FR) .............................. 00 04909

(51) Int. Cl.[7] .................................................. H03K 4/06
(52) U.S. Cl. ........................................ 327/131; 327/134
(58) Field of Search ................................. 327/131–134, 327/140

(56) References Cited

U.S. PATENT DOCUMENTS

| 5,434,456 A | | 7/1995 | Booth ......................... 307/108 |
| 6,069,414 A | * | 5/2000 | Fulkerson .................... 307/106 |
| 6,198,269 B1 | * | 3/2001 | Beeley ........................ 323/361 |

FOREIGN PATENT DOCUMENTS

WO          98 26505        6/1998

* cited by examiner

Primary Examiner—Timothy P. Callahan
Assistant Examiner—Cassandra Cox
(74) Attorney, Agent, or Firm—Oblon, Spivak, McClelland, Maier & Neustadt, P.C.

(57) ABSTRACT

A fast scanning voltage ramp generator including at least one chain of N two-pole avalanche transistors in series and a set of N+1 zener diodes in series between a high voltage power supply and ground, where N is an integer number$\geq 2$. A streak camera can utilize this type of generator.

12 Claims, 6 Drawing Sheets

FAST SWEEP VOLTAGE RAMP GENERATOR AND STREAK CAMERA USING SAME

TECHNICAL DOMAIN

The invention relates to a fast scanning voltage ramp generator and a streak camera using such a generator.

STATE OF PRIOR ART

As described in "*Improvement in avalanche—transistor sweep circuitry for electropic streak cameras*" by S. W. Thomas, R. L. Griffith and W. R. McDonald (16th International Congress. "*High Speed Photography and Photonics*". Strasbourg, Aug. 27–31, 1984) streak cameras used for the diagnostic of fast photonic phenomena (in visible light or X-rays) are composed of a photocathode that converts photons into electrons, an electron acceleration and deviation system, and an image recovery system.

FIG. 1 diagrammatically illustrates such a streak camera that includes:

a photocathode 10, a horizontal slit 11, two deflection plates 12, an anode 13, an image recovery system 14.

In this type of camera, the basic phenomenon as a function of time is spread on the recovery screen 14. It is transformed into a function of a distance. The use of such a camera requires the use of a scanning generator that outputs a positive ramp applied to one of the deviation plates 12 of the electron beam, +V1, and a negative ramp applied to the other deviation plates 12, −V2. The result is a common mode about the average potential of these two plates 12.

The quality of the resulting final images is directly related to the quality of the scanning ramps:

linearity, speed (in volts/nanosecond), stability.

For the technology used to make this type of scanning ramp generator, the cameras may be classified as a function of the speed of the phenomena to be observed.

Thus, we refer to:

"microsecond camera": scanning period>1 µs

"nanosecond camera": scanning period<1 µs

"picosecond camera": scanning period<1 ns

"femtosecond camera": scanning period<100 ps.

A voltage of about 400 volts per deflection plate 12 (or per ramp) is necessary to obtain a spread (distance AB illustrated in FIG. 1) equal to 30 mm.

The following components must be used to obtain such a voltage:

400 V/µs ("microsecond camera"): triode type vacuum tubes MOSFET type transistors, 400 V/ns ("nanosecond camera"): avalanche type transistors installed in a chain, 400 V/100 ps ("picosecond camera"): avalanche type transistors installed in a chain. But in this case a high voltage is generated (for example 3 kVolts in 1 ns), and only a linear part of about 400 volts is used.

The combination of avalanche transistors in the form of a chain is thus described in "*Avalanche transistors provides fast power transients*" (*Electronic engineering*, February 1991).

All ramp generators thus obtained according to known art are usually complicated, close to the limits of the technology and furthermore very frequently have a high impedance output. This is applicable for generators described in "*The development of high peak power solid state pulse generators*" by A. K. L. Dymok-Bradshaw, J. D. Hares. P. A. Kellet and J. Westlake (Kentech Company, 26.5.1994), which considers the use of chains of avalanche transistors for an application to high speed optical cameras.

The purpose of this invention is to overcome the disadvantages of devices according to known art by proposing a generator outputting a fast positive ramp and/or a fast negative ramp using the principle of chains of avalanche transistors.

PRESENTATION OF THE INVENTION

This invention relates to a fast scanning voltage ramp generator including at least one chain of N two-pole avalanche transistors in series and a set of N power supply elements in series, where N is an integer number $\geq 2$, for example equal to 8, the emitter and the base of each transistor being connected to each other and also being connected to the collector of the next transistor in the chain, an input circuit generating a voltage pulse connected to one of the two transistors at the end of the chain, characterized in hat the set of N+1 power supply elements in series is formed by a set of N+1 zener diodes in series between a high voltage power supply and the ground, and in that the collector and the emitter of each transistor in the chain are connected firstly to the cathode and to the anode of a corresponding zener diode through at least one resistance, and secondly to the ground through a corresponding capacitor.

Advantageously, the generator includes two chains of two-pole transistor to generate two positive and negative voltage ramps.

Advantageously, the input circuit in the first chain is connected to the first transistor in this chain through an inverter transformer and a capacitor so as to transmit a positive pulse received at the input on the collector of this first transistor. The emitter of the last transistor of the first chain is connected to the output of the positive ramp through a capacitor. The input circuit to the second chain is directly connected to the emitter of the last transistor in the second chain to send it a negative pulse received as input. The collector of the first transistor in the second chain is connected to the output of the negative ramp through a capacitor. A resistance is placed between the high voltage power supply and the zener diodes in series.

Advantageously each resistance used in each chain is composed of three surface mounted component type resistances.

Advantageously, each capacitor in each of the two chains is of the "patch" type.

Advantageously, the avalanche transistors are of the FMMT 415 type made by the Zetex Company.

The invention also relates to a streak camera using a ramp generator as described above.

The ramp generator according to the invention using a particular topology of printed circuit and particular avalanche components enables:

a very small size (<50 cm$^3$), a single power supply (about +2500 volts), an amplitude of about 1000 volts on 50 ohms for each output, a slope of 10 volts/picosecond, namely 400 volts in 40 picoseconds (application to femtosecond cameras), stability when starting (jitter) of 5 picoseconds.

ZTX 415 or FMMT 415 avalanche type transistors made by the ZETEX Company as used normally and as indicated by the manufacturer cannot switch in less than 1.5 ns; in the generator according to the invention, they are used to obtain ramps of 0.1 to 0.13 ns.

DETAILED PRESENTATION OF PARTICULAR EMBODIMENTS

The ramp generator according to the invention uses avalanche transistor chains. This type of avalanche transistor is a two-pole transistor that has a collector current-collector voltage characteristic with a negative slope, when the base-emitter resistance is low. It forms a very fast switch which closes controlled either by the base or by exceeding the limiting voltage of the collector. In the latter case, the base and the emitter are connected together. Operation of this transistor is then similar to operation of a conventional splitter. The invention only uses this second case.

Figure 2:
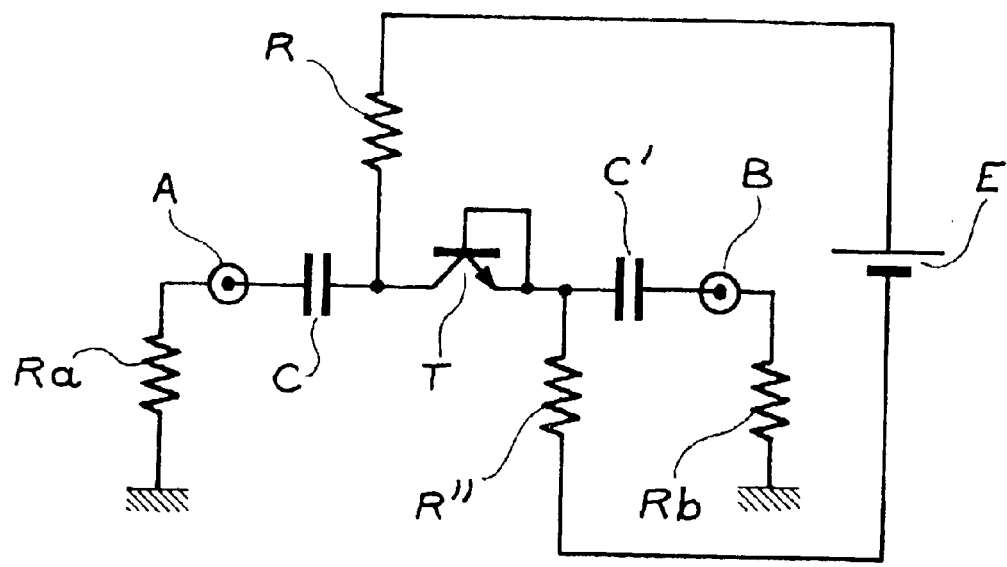
FIGS. 2 and 3 illustrate the operating principle of the generator according to the invention.
Figure 3:
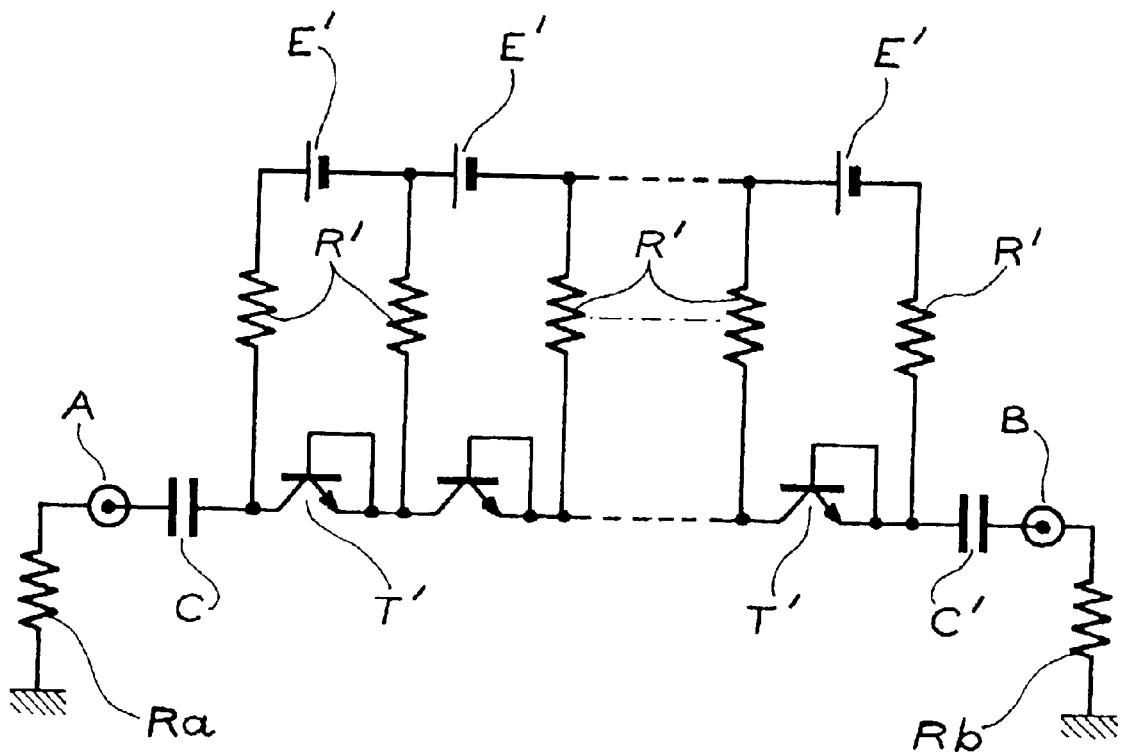

FIG. 2 illustrates the installation of such an avalanche transistor T. The base and the emitter of this transistor T are connected together. The collector of this transistor is connected firstly to the ground through a capacitor C and a resistance Ra, and secondly to the + terminal of a DC source E through a resistance R. The emitter of this transistor is connected firstly to the ground through a capacitor C' and a resistance Rb, and secondly the − terminal of the source E through a resistance R".

The DC source E polarizes this transistor T through two and R" to a value less than its breakdown voltage.

The two capacitors C and C' are charged to this value E.

Two cases can then arise:

a positive pulse is applied at point A so that the breakdown voltage can be exceeded. The effect of this is to make the avalanche transistor T switch over and to introduce a positive ramp at point B by discharging the two capacitors C and C', a negative pulse is applied at point B. This also has the effect of switching the avalanche transistor T and introducing a negative ramp at point A by discharging the two capacitors C and C'.

The amplitude of the signals output by this type of avalanche transistor generator depends on the limiting voltage of the collector. If it is required to have larger amplitudes, a chain of transistors T' is used as shown in FIG. 2.

Figure 1:
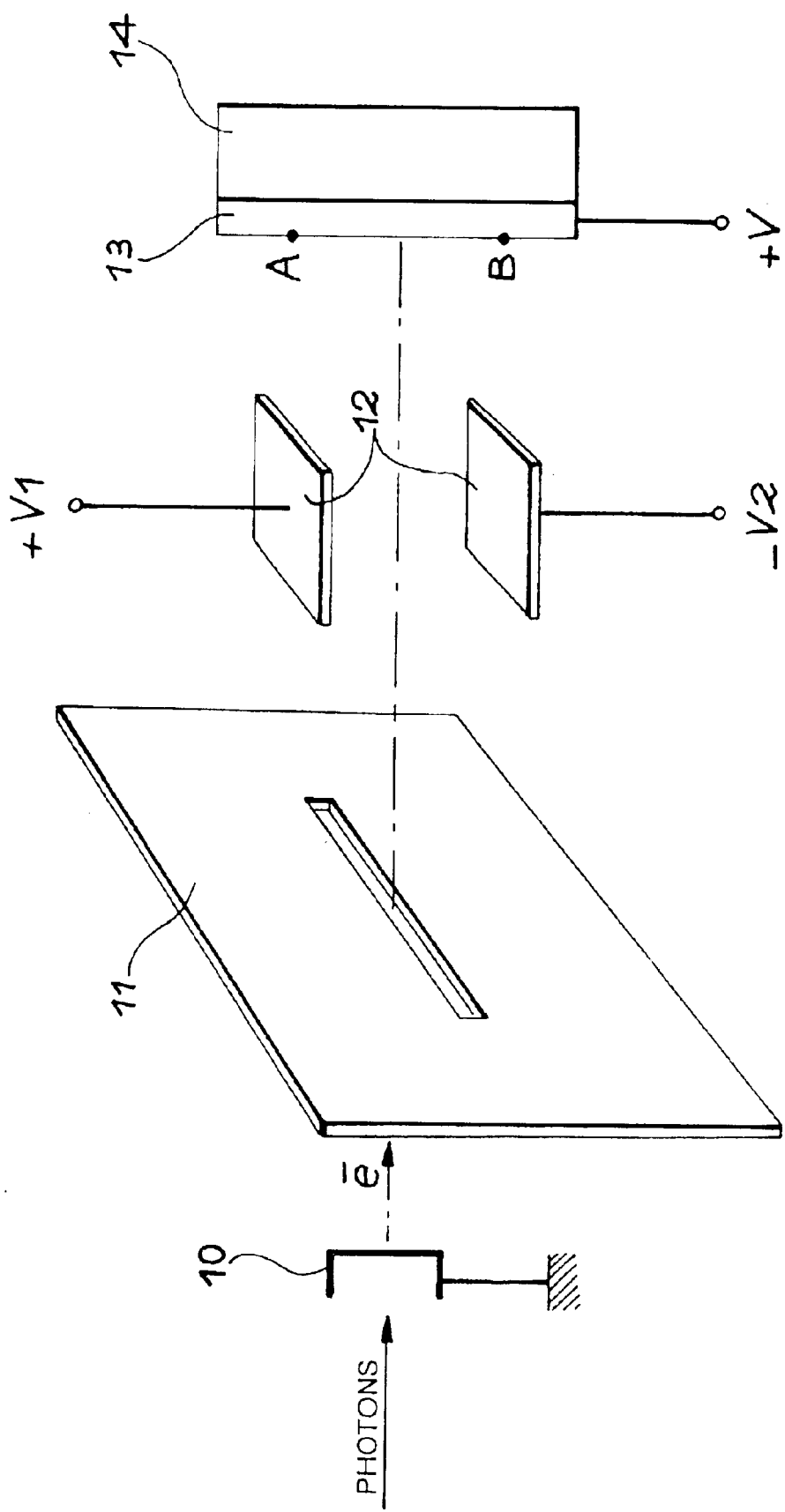
FIG. 1 diagrammatically illustrates a streak camera.

The transistor T in FIG. 1 is then replaced by N transistors T' in series, each transistor T' having its collector connected to the + terminal of a source of a set of voltage sources E' arranged in series through a resistance R'. Each transistor T' is powered at the limit, like transistor T in the circuit shown in FIG. 1.

In the same way as for the operation described for the single transistor T in FIG. 1, a positive pulse at A will produce a large positive ramp at point B (N times the ramp of the single transistor T). Similarly, a negative pulse at point B will produce a large negative ramp at point A. In both cases, all transistors T' switch over at the same time.

If it is required to have a positive ramp and a negative ramp at the same time, then two chains of avalanche transistors are necessary like those shown in FIG. 2; the input and output for each ramp being located on different sides—at A or at B.

Figure 4:
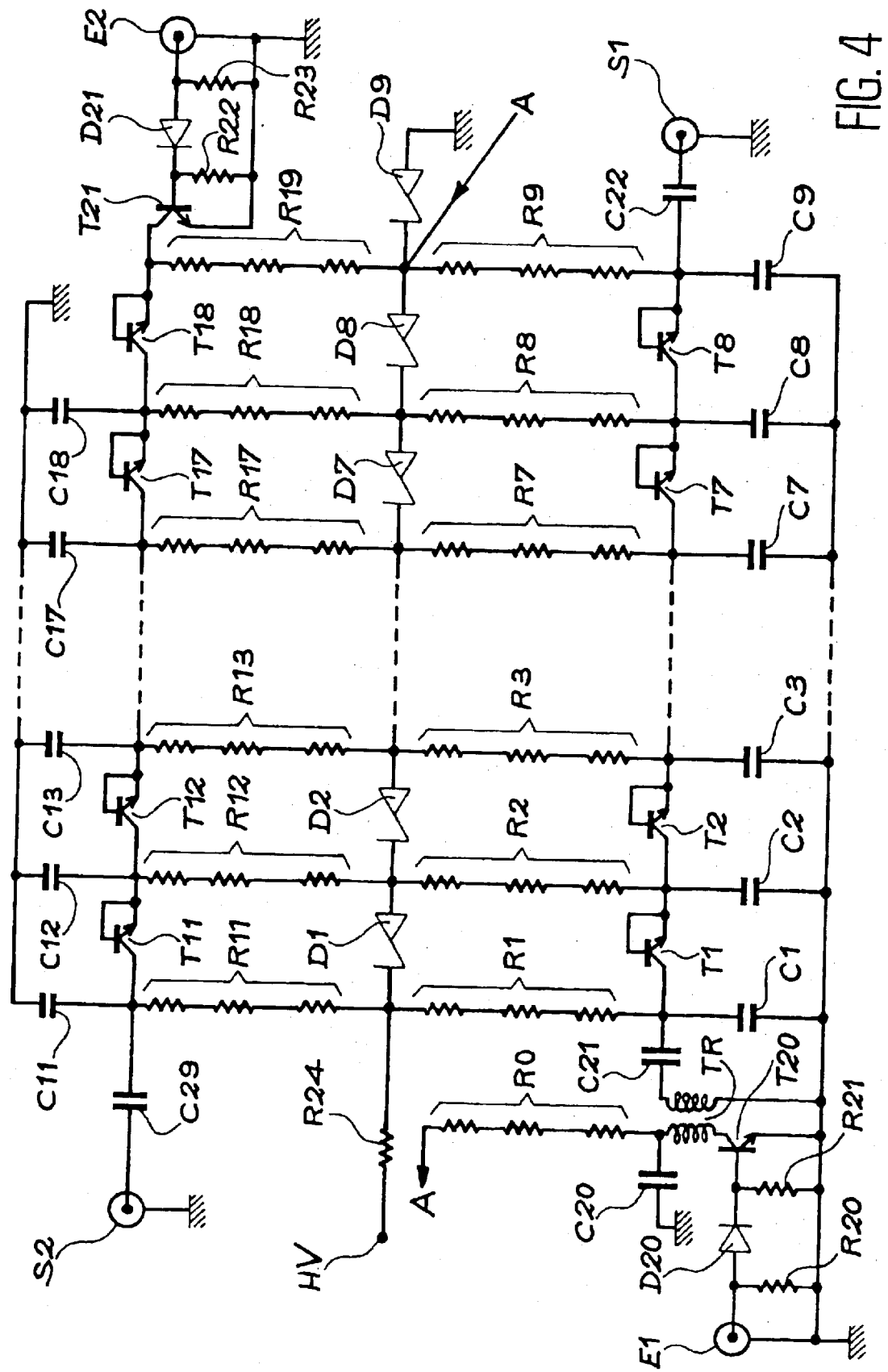
FIG. 4 illustrates an example embodiment of a fast scanning voltage ramp generator according to the invention.

FIG. 4 illustrates the layout of a generator of positive and negative ramps according to the invention, made using two chains, each with eight avalanche transistors.

This generator includes a first chain of N two-pole NPN type avalanche transistors T1–T8, in this case 8 of them in series, and a second chain of N NPN ype two-pole avalanche transistors T11–T18 in series, and a set of N+1 power supply elements in series, in this case consisting of zener diodes D1–D9 in series between a high voltage power supply HV and the ground. In each chain, the emitter and the base of each transistor T1–T8 and T11–T18 are connected together and are also connected to the collector of the next transistor; the collectors and emitters of each transistor are connected firstly to the cathode and the anode of a corresponding zener diode through at least one resistance R1–R8 or R11–R18, for example through three surface mounted type resistances placed on th printed circuit of the generator, and also to the ground through a corresponding capacitor C1–C9; C11–C18.

For each chain, an input circuit used to transmit a voltage pulse is connected to a transistor at the end of the chain.

The first input circuit is formed from a transistor T20, the base of which is connected to the ground through a resistance R21 in parallel with the resistance R20 in series with a diode D20, the emitter of which is connected to the ground and for which the collector is connected to the cathode of the zener diode D9 through the primary of a transformer TR in series with a resistance R0. It receives a positive pulse at E1 and is used to apply a positive control pulse on the collector of the first transistor T1 of the first chain of transistors T1–T8.

The second input circuit formed in a similar manner from a transistor T21, a diode D21 and a resistance R22 and R23, receives a negative pulse at E2. IT is used to apply a negative control pulse to the emitter of the last transistor T18 in the second chain of transistors T11–T18.

The first input circuit in the first chain T1–T8 is thus connected to the first transistor T1 in this chain through the inverter transformer TR and a capacitor C21 to transmit a positive pulse received at the input E1 to the collector of this first transistor T1. The emitter of the last transistor T8 in the first chain is connected to the positive ramp output S1 through a capacitor C22.

The second input circuit in the second chain T11–T18 is connected directly to the emitter of the last transistor T18 in the second chain to transmit a negative pulse received at input E2 to it. The collector of the first transistor T11 in the second chain is connected to the negative ramp output S2 through a capacitor C29.

A resistance R24 is placed between the high voltage power supply HV and zener diodes D1 to D9 in series.

A very advantageous characteristic of the generator according to the invention is that the voltages polarizing transistors T1 to T8 and T11 to T18 in the two chains starting from the single positive HV power supply are obtained using zener diodes D1 to D9.

Capacitors C1 to C9 and C11 to C18 are advantageously made using patches on the printed circuit of the generator according to the invention. Their value red ces from C1 to C9 and from C18 to C11. They are designed to compensate for parasite inductances of the two transistor chains.

Advantageously, the configuration of this generator prevents any disturbance between transistors T11–T18 and transistors T1–T8.

In one example embodiment, the following components are used:

Diodes
 D1–D9: 270 V diodes
 D20, D21: 1N4148
Resistances
 R0–R19: three 22000 Ω resistances (SMC)
 R20, R22: 56 Ω
 R21, R23: 68 Ω
 R24: 15000 Ω, 1 W
Capacitors
 C1–C9 and C11–C18: patches on the printed circuit
 C20: 470 pf, 300 V
 C21, C22, C23: 470 pF, ceramic 2.5 kV
Transistors
 T1–T8, T11–T18, T20, T21: FMMT 415, Zetex SOT 23
Transformer
 TR: inverter transformer
DC power supply
 HV: +2460 V to +2500 V
Inputs
 At E1 and at E2: 2 V pulses
Outputs
 S1: positive ramp 1 kV/130 ps
 S2: negative ramp 1 kV/130 ps In the printed circuit technology, this type of generator with a 100×90 mm$^2$ format can be reduced to the size of two credit cards.

Figure 5:
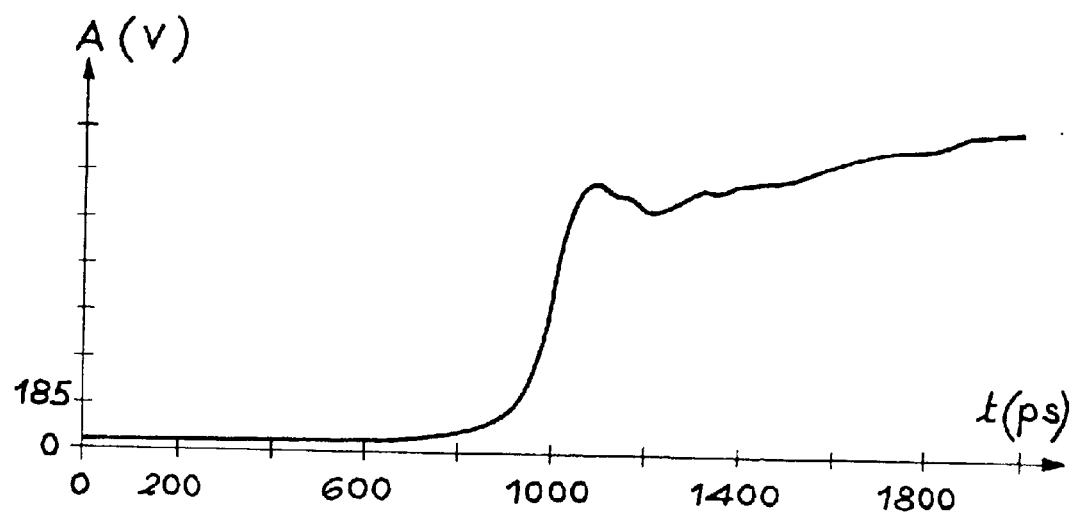
FIGS. 5 to 9 represent operational curves of the generator according to the invention illustrated in FIG. 4.
Figure 6:
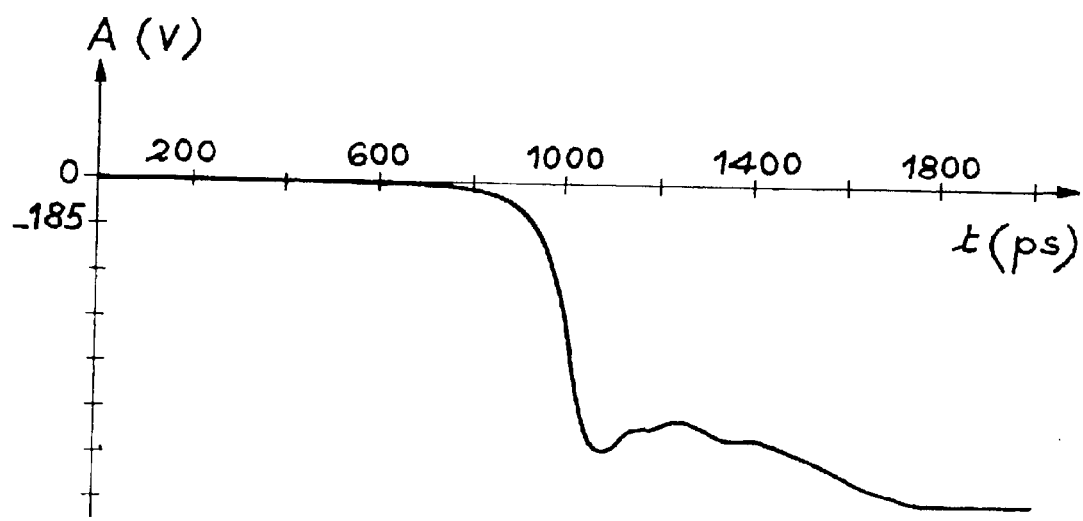
Figure 8:
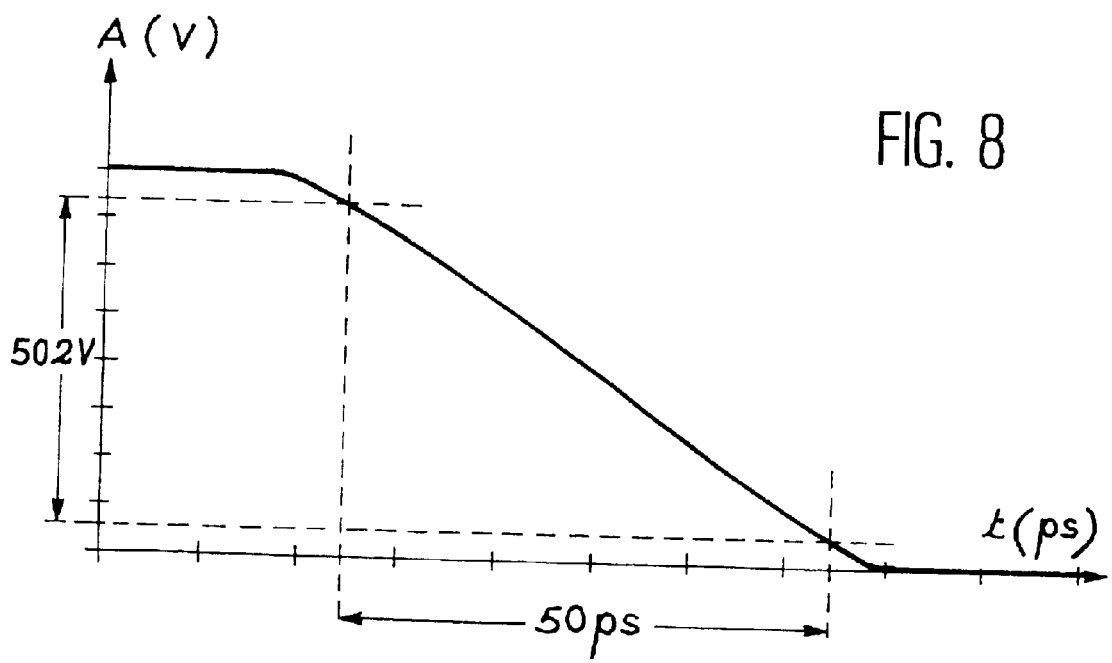
Figure 9:
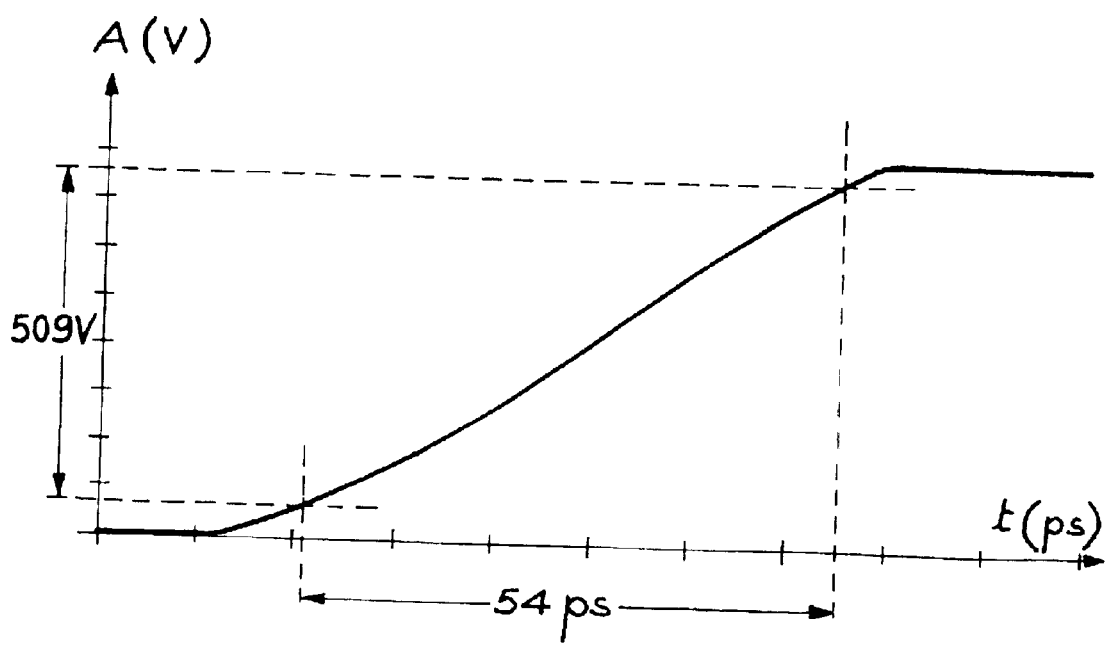

The ramp generator according to the invention described above can be used to obtain positive and negative ramps like those shown in FIGS. 5 and 6, of the order of 1000 volts with rise times of 130 picoseconds. In areas with maximum linearity, as shown in FIGS. 8 and 9, a variation of about 500 volts is obtained in 50 picoseconds.

Figure 7:
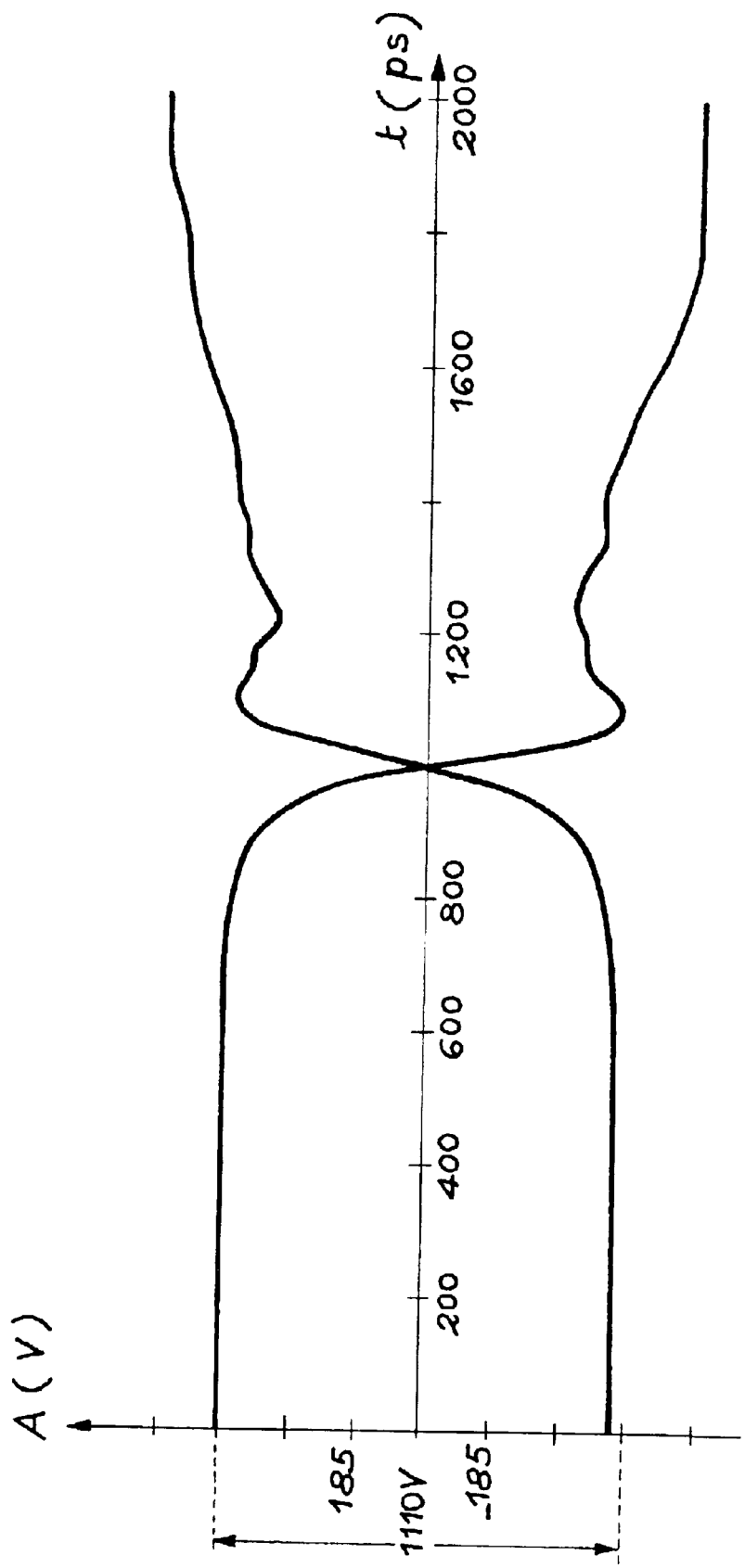

FIG. 7 shows the symmetry of the two ramps illustrated in FIGS. 5 and 6, obtained by offsetting each ramp. Thus, in use with a streak camera, it is possible to add DC voltages to make the curves symmetrical with a zero median voltage.

Considering the fact that the output is matched on 50 ohms, the generator according to the invention does not need to be in the camera, and the connection can be made through 50 ohms lines.

This ramp generator may advantageously be followed by a balancing circuit according to known art, such as the Balun, which also acts as an impedance transformer. It is thus possible to obtain two ramps (positive and negative) each at 2 kV on 200 ohms. Furthermore, the symmetry obtained gives better operating reliability.

It is possible to use special entirely passive Gaussian type filters to obtain slower scanning ranges (1 ns, 2 ns, . . . ) on the deviation plates 12 in the streak camera.

This ramp generator may advantageously be followed by a differentiating circuit. Thus, two fine positive and negative pulses can be obtained, with a width of about 50 picoseconds at mid-height and an amplitude of 500 volts (which is only limited by the number N of transistors). When applied to an antenna, these pulses can be used to obtain a radar system.

What is claimed is:

1. Fast scanning voltage ramp generator comprising:
 at least one chain of N two-pole avalanche transistors in series and a set of N+1 power supply elements in series, where N is an integer number≧2, an emitter and base of each transistor being connected to each other and also being connected to a collector of a next transistor in the chain;
 an input circuit generating a voltage pulse connected to one of two transistors at ends of the chain,
 wherein the set of N+1 power supply elements in series is formed by a set of N+1 zener diodes in series between a high voltage power supply and ground, and
 wherein the collector and the emitter of each transistor in the chain are connected to a cathode and to an anode of a corresponding zener diode through at least one resistance, and are connected to the ground through a corresponding capacitor.

2. Generator according to claim 1, wherein said at least one chain comprises first and second chains of two-pole transistors to generate a positive voltage ramp and a negative voltage ramp.

3. Generator according to claim 2, wherein the input circuit in the first chain is connected to a first transistor in the first chain through an inverter transformer and a capacitor to transmit a positive pulse received at input on the collector of the first transistor.

4. Generator according to claim 3, wherein the emitter of a last transistor of the first chain is connected to an output of the positive ramp through a capacitor.

5. Generator according to claim 2, wherein the input circuit to the second chain is directly connected to an emitter of a last transistor in the second chain to send the last transistor a negative pulse received as an input.

6. Generator according to claim 5, wherein a collector of a first transistor in the second chain is connected to an output of the negative ramp through a capacitor.

7. Generator according to claim 1, wherein a resistance is placed between the high voltage power supply and the zener diodes in series.

8. Generator according to claim 1, made using printed circuit technology, and wherein each resistance comprises three surface mounted component resistances.

9. Generator according to claim 8, wherein each capacitor is a patch capacitor.

10. Generator according to claim 1, wherein N is equal to 8.

11. Generator according to claim 1, wherein the avalanche transistors are FMMT 415 type made by Zetex Company.

12. Streak camera using a ramp generator according to claim 1.

* * * * *